United States Patent
Lamson et al.

(10) Patent No.: US 7,195,954 B2
(45) Date of Patent: Mar. 27, 2007

(54) LOW CAPACITANCE COUPLING WIRE BONDED SEMICONDUCTOR DEVICE

(75) Inventors: Michael A. Lamson, Westminster, TX (US); Homer B. Klonis, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 220 days.

(21) Appl. No.: 10/836,949

(22) Filed: May 3, 2004

(65) Prior Publication Data

US 2004/0207096 A1  Oct. 21, 2004

Related U.S. Application Data

(62) Division of application No. 09/989,263, filed on Nov. 19, 2001, now Pat. No. 6,822,340.

(60) Provisional application No. 60/252,126, filed on Nov. 20, 2000.

(51) Int. Cl.
  *H01L 21/44* (2006.01)
  *H01L 21/48* (2006.01)
  *H01L 21/50* (2006.01)

(52) U.S. Cl. ............... 438/112; 438/612

(58) Field of Classification Search ........... 438/112, 438/124, 127, 612, 613, 617
See application file for complete search history.

(56) References Cited

U.S. PATENT DOCUMENTS

| | | | |
|---|---|---|---|
| 4,048,670 A | 9/1977 | Eysermans | 361/421 |
| 4,716,073 A | 12/1987 | Randa | 428/215 |
| 4,821,148 A | 4/1989 | Kobayashi et al. | 361/392 |
| 5,172,214 A | 12/1992 | Casto | 257/676 |
| 5,656,830 A * | 8/1997 | Zechman | 257/784 |
| 5,801,074 A | 9/1998 | Kim et al. | 438/125 |
| 5,824,568 A | 10/1998 | Zechman | 438/112 |
| 6,013,109 A | 1/2000 | Choi | 938/124 |
| 6,198,170 B1 | 3/2001 | Zhao | 257/784 |
| 6,329,278 B1 * | 12/2001 | Low et al. | 438/617 |
| 6,368,899 B1 | 4/2002 | Featheby et al. | 438/127 |

FOREIGN PATENT DOCUMENTS

| | | |
|---|---|---|
| EP | 0 355 955 | 2/1990 |
| JP | 51126765 | 5/1976 |
| JP | 6308-554 | 11/1988 |
| JP | 07202053 | 4/1995 |

* cited by examiner

*Primary Examiner*—Hoai Pham
(74) *Attorney, Agent, or Firm*—Wade James Brady, III; Frederick J. Telecky, Jr.

(57) ABSTRACT

A semiconductor device having reduced self and mutual capacitance of bonded wires is provided by coating the wires with a foamed polymer effectively having a very low dielectric constant. Additional benefits are realized by electrically insulating the wires against short-circuiting, by cushioning the wires with a low modulus sheath, and by protecting chip bond pad metallization

TABLE 1

Method of Moments Capacitance Models

| Wire Dimensions | | 25 × 25 microns | |
|---|---|---|---|
| Separation between Wires | | 63.5 microns | |
| Distance to ground | | 191 microns | |
| Model | Dielectric constant of separation | Self capacitance Wire 1  Wire 2 | Mutual Capacitance |
| Model | Dielectric constants | Wire 1 self cap pf/cm   Wire 2- self cap pf/cm | Mutual cap pf/cm |
| Plastic encased package | 4.0 | 1.03   0.54 | 1.57 |
| Cavity package | 4./1.0/4. | 0.31   0.12 | 0.43 |
| Foam sheath wires/molded | 4./1./4./1./4. | 0.34   0.16 | 0.50 |
| Wires - no package | 1. | 0.26   0.13 | 0.39. |

13 Claims, 3 Drawing Sheets

(1)

LOW CAPACITANCE COUPLING WIRE BONDED SEMICONDUCTOR DEVICE

This application is a division of Ser. No. 09/989,263, filed Nov. 19, 2001 now U.S. Pat. No. 6,822,340 which claims priority under 35 U.S.C. § 119 based upon Provisional Application Ser. No. 60/252,126, filed Nov. 20, 2000.

FIELD OF THE INVENTION

This invention relates generally to semiconductor devices, and more particularly to wire bonded integrated circuits.

DESCRIPTION OF PRIOR ART

In fabrication of plastic encapsulated semiconductor devices, the electrically conductive pads of an integrated circuit chip are connected to electrically conductive external leads by means of a very thin wire, typically a gold wire. As shown in FIG. 1a, during molding to encapsulate chip 10 and leads 12, using a dielectric plastic molding compound 14, there is a tendency for wires 11 to distort. This lateral distortion of the wires in the direction of flow of molding compound, represented by arrow 15 is referred to as wire sweep. In FIG. 1b, a gold bond wire 11 is formed in an arc shape between the chip pad 13 and the lead finger 12 in order to prevent wire shorting to either the chip edge, or to the supporting chip pad 14. However, as illustrated in FIG. 1c, a wire 21 often does become deformed, not only by mold compound flow, but also by vibration, mechanical damage or other means, and the tendency for distortion is strongly aggravated by decreasing wire thickness and increasing wire length. As control of the arc shape is lost, spacing between wires is no longer in control.

As the trend to increase the number of input/output connections on circuits has continuously increased, the spacing between pads on the chip has decreased, double tiers of bonding pads have been included, and the length of wires has increased. Leads cannot be fabricated with the same high density as chip pads, and therefore wire lengths have increased in order to allow connection between the leads and closely spaced pads on the chip.

Capacitance loading increases directly with increased wire length, and wire lengths are currently approaching one centimeter. As the wires are brought closer together by design, and/or by wire sweep or other distortion, the separation between wires decreases. All of these factors have a tendency to cause parasitic capacitance coupling between the wires, as well as for short-circuiting of the wires. Increased mutual capacitance between neighboring wires increases electrical noise and affects signal transmission of the circuit. Both self capacitance of long wires and mutual capacitance between wires have become significant obstacles to low cost wire bonded, high speed integrated circuits.

Various attempts have been made to electrically insulate bond wires, by coating with a dielectric material either before or after bonding, and thus to prevent shorting. In several instances wires have been coated with polymers which decompose with heat during the bonding operation. Alternately, thin films of silicones, parylene, other polymers, or even plasma enhanced chemically vapor deposited SiO2 have been applied after wire bonding. However, none have been widely accepted because of deleterious side effects.

Further, almost no attention has been paid to requirements for, or methods to minimize capacitance coupling, and thus improve both reliability and performance of circuits. As the speed of circuits has increased, the parasitic capacitance of wire bonded circuits has become very serious in light of the fact that wire bonded devices, both now and for a some time in the future, will continue to be the economical and preferred method of interconnecting chips to package leads, and therefore a means to minimize the capacitance issues would be very beneficial to the industry.

SUMMARY OF THE INVENTION

It is an object of this invention to provide a wire bonded integrated circuit device having low mutual capacitance between the wires, and thus minimize parasitic coupling and cross talk attributable to bond wires.

It is an object of this invention to provide a method for isolating neighboring wire bonds from each other in order to minimize self and mutual capacitance of the wires.

It is an object of the invention to provide a means to insulate bond wires from each other after the wire bonding process has been completed.

It is an object of the invention to provide a means to insulate bond wires from each other after the wire bonding process has been completed, without requiring any cleaning of the leads, internal or external to the molded package.

It is an object of the invention to provide a very low dielectric medium surrounding bond wires which minimizes capacitance coupling between wires, and which eliminates short-circuiting.

It is an object of the invention to provide a dielectric material surrounding bond wires which further effectively has a low modulus of elasticity, and supports enhanced reliability of the device.

It is an object of the invention to decrease mutual capacitance between wires by a factor of about 3 from comparably dimensioned plastic molded wire bonded devices.

The aforementioned objectives are met by first using an electromagnetic model to analyze the capacitance of neighboring wires separated by epoxy molding compound, of wires separated by air only, and of wires separated by a layer of a very low dielectric constant sheath on the wires prior to embedding in a mold compound. Analysis of the data indicates that only a thin layer, approximately 2.5 microns on all sides, of a very low dielectric constant material surrounding the wires will reduce mutual capacitance by a factor of about 3 from that of epoxy molding compound having a dielectric constant of 4. Air as the dielectric for wires at 40 microns separation would provide a 4.5 times decrease from that of molded epoxy. However, because air separation is not a viable solution for plastic molded devices, or even a reliable solution for cavity packages, a very low dielectric constant dielectric constant sheath is provided as a means of minimizing mutual capacitance, and resulting crosstalk.

In order to form a usable, truly low dielectric constant medium surrounding the wire, a foamed polymer having pockets of air or other gas incorporated into the medium is provided. Density of the polymer is decreased, and effectively both the dielectric constant and modulus are decreased by foaming. One method for fabricating such a layer is to react components of a polymer which produce and incorporate gas pockets during curing. Alternate methods for foaming the dielectric medium include adding blowing agents to a polymer prior to curing, thereby capturing air within the medium, and providing the necessary properties. Foamed polymers form low-density embedding materials, reduce the dielectric constant significantly, without creating a rigid coating, such as that found with low dielectric materials, such as polyimides. Further, foamed polymers are processed at temperatures acceptable for wire bonded integrated circuit devices, and they do not require high temperature processing, as do some polymers.

DETAILED DESCRIPTION OF THE INVENTION

In order to ensure proper signal transmission and timing of integrated circuits, prediction and control of electrical parameters of a packaging system are analyzed using electromagnetic computer modeling and simulation programs. Such electrical modeling programs are both commercially available and have been developed by a number of universities. The geometry and material properties of a series of conductors and insulators are input to the computer program, and the output includes a matrix of capacitance, inductance of the conductors and resulting impedance of the leads in question, and of the surrounding leads.

Figure 1A:
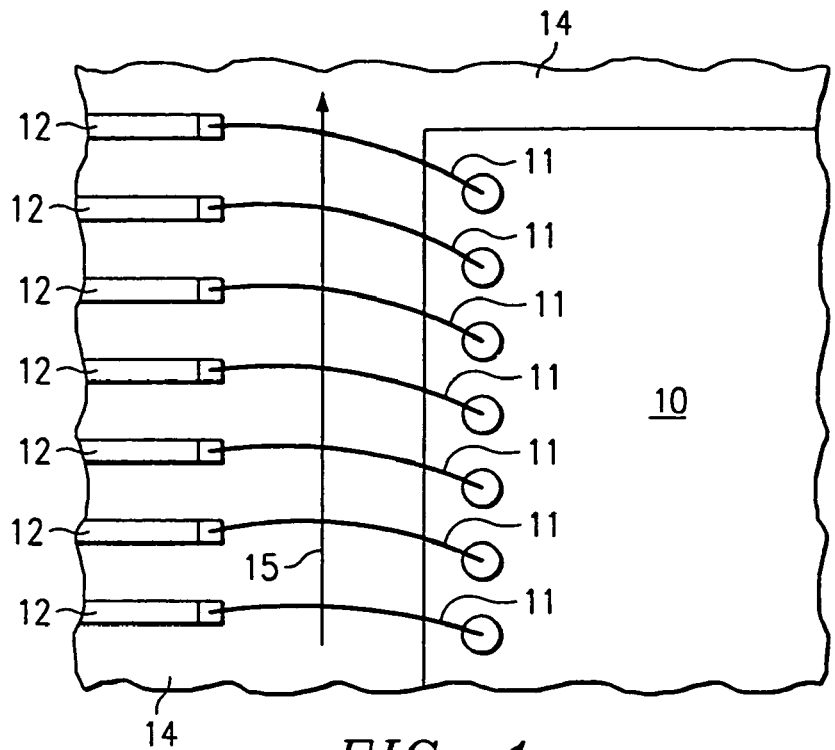
FIG. 1a shows a wire-bonded integrated circuit having wires swept laterally by mold compound flow. (Prior Art)
Figure 1B:
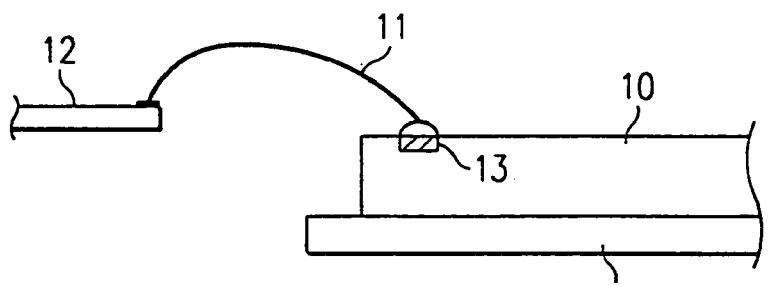
FIG. 1b is a section of a wire bonded device. (Prior Art)
Figure 1C:
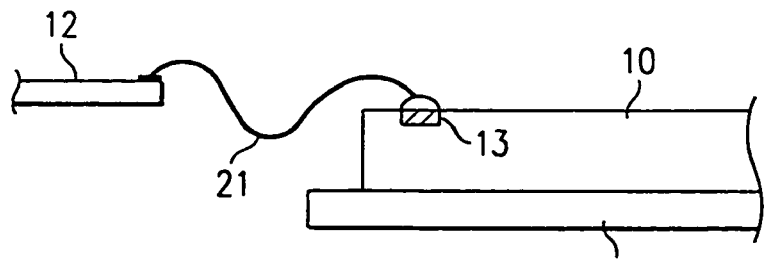
FIG. 1c illustrates a sagging wire bond. (Prior art)
Figure 2A:
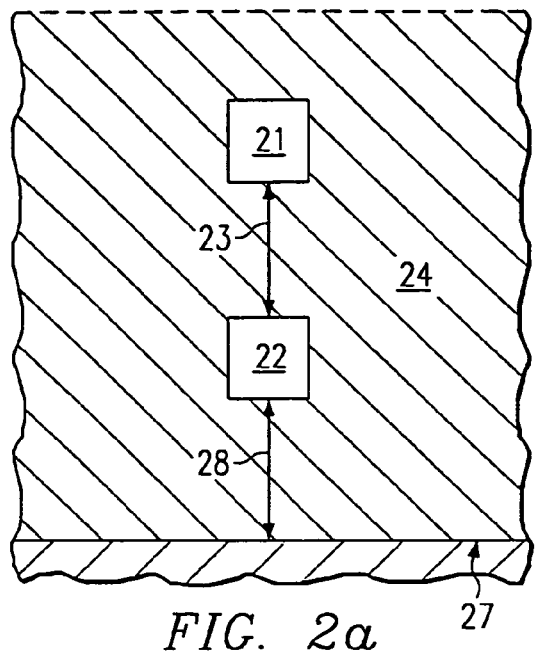
FIG. 2a is a model of a plastic encapsulated integrated circuit device with neighboring bond wires.
Figure 2B:
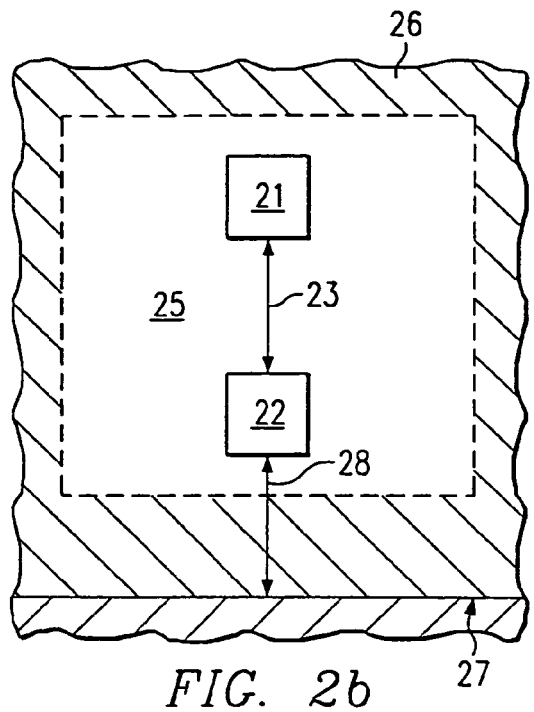
FIG. 2b is a model of wire bonds surrounded by air, and the assemblage encased in plastic, as in a cavity package.

Prediction of capacitance loading in a wire bonded integrated circuit device is analyzed using such a modeling program. FIG. 2a illustrates a pair of wires 21 and 22, each 25 microns in diameter, and separated by a distance 23. The separation is filled by a material 24 having a dielectric constant 4.0, which is typical of epoxy molding compounds used for encapsulating wire bonded circuit devices. Bond wire 22 is positioned at a distance represented by an arrow 28 above a ground plane 27, which is not integral to the package, but assumed to be in the circuit board. FIG. 2b is a model of a device having the same dimensions, but housed in the cavity of a shell 26 having a dielectric constant of 4.0. The cavity and space between wires is filled by air 25 having a dielectric constant of 1.0. This model is representative of a cavity package.

Figure 3:
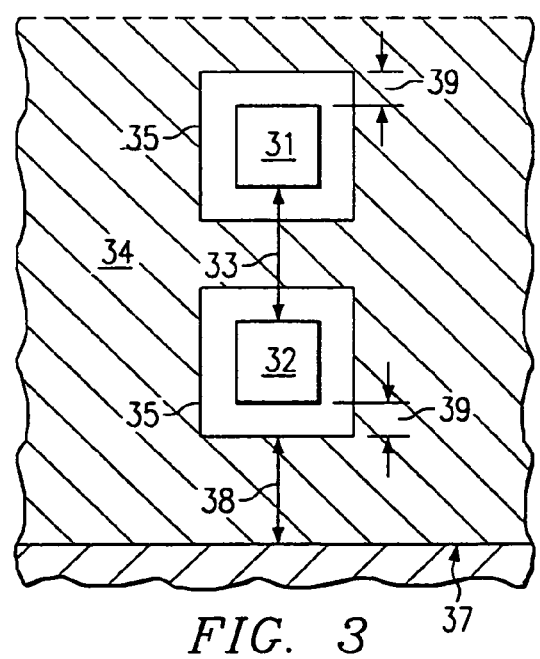
FIG. 3 is a model of a plastic encapsulated integrated circuit device in accordance with the invention having a layer of low dielectric coating surrounding wires.

FIG. 3 illustrates a model of a device having the same wire dimensions and spacing as in FIGS. 2a and 2b, but with a low dielectric constant layer 35 surrounding each wire 31 and 32. The dielectric sheath 35 has a thickness represented by arrows 39 of 2.5 microns on each side. A material 34 having a dielectric constant 4.0 encapsulates the assemblage, and fills the space between the dielectric coated wires.

Capacitance results of this model are compared in Table 1 to those of the encapsulated device (FIG. 2a) having no wire coating, the cavity device (FIG. 2b) having air between wires. In addition, for comparison, results of a model of wires having no encapsulant, with air only between the wires and ground is included in Table 1.

From these data, the mutual capacitance of wires in the molded device having no wire coating is 1.57 pf/cm or a factor of about 3.65 times greater than that of the cavity type device having air separation between the wires, and about 3.14 times greater than the device of this invention having a thin, very low dielectric constant layer surrounding the wires. Mutual capacitance of wires with only air surrounding and separating from a ground plane is 0.39 pf/cm, as compared to 0.43 pf/cm for a cavity package, and 0.50 pf/cm for a molded device having a sheath of low dielectric constant material. However, the practicality of air as a dielectric between wires is the inability to control spacing, resulting not only in capacitance coupling, but also in wire shorting. Each of the models having a low dielectric constant medium surrounding the wires has significantly lower self and mutual capacitance than the model representing a conventional molded device (FIG. 2a), and provides a significant reduction in probability of parasitic coupling and cross talk in a circuit. However, only the sheathed wires offers a practical, manufacturable solution.

Figure 4A:
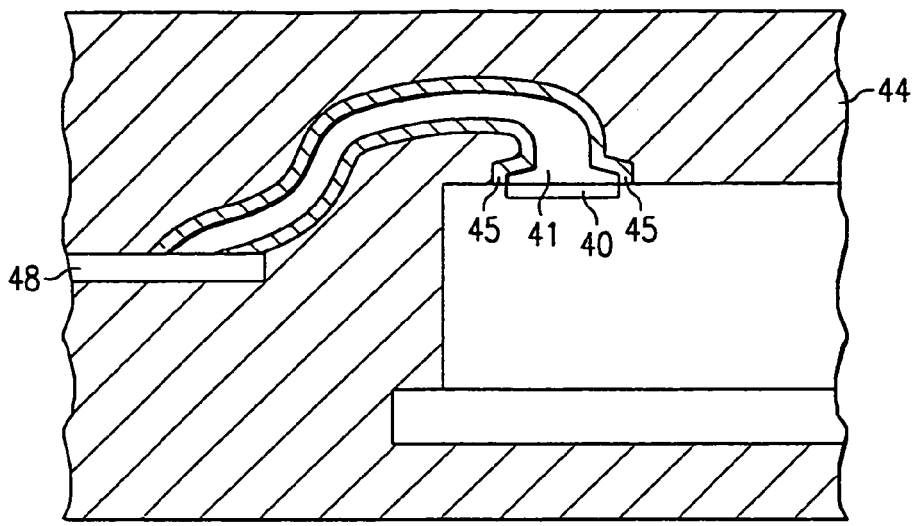
FIG. 4a is a section of a wire bonded device illustrating an embodiment of the invention having a low dielectric sheath surrounding the wire.

FIG. 4a is a device of the current invention, having a wire 41 bonded to a chip contact pad 40, and to a lead 48, and having a low dielectric constant sheath 45 conforming to the wire. Bond wires are separated by a distance equal to or greater than the wire diameter, typically in the range of 50 to 75 microns. The coating, or sheath 45 which has been applied after the wire bonding process, extends onto both the chip surface and the portion of the lead where the wire is attached. This extension of the dielectric coating provides further reliability enhancement to the device by covering the fragile bond pad metallization. The chip, wire, coating, and inner lead are encased by a molding compound 44, typical of that used in plastic molded IC packages.

Figure 4B:
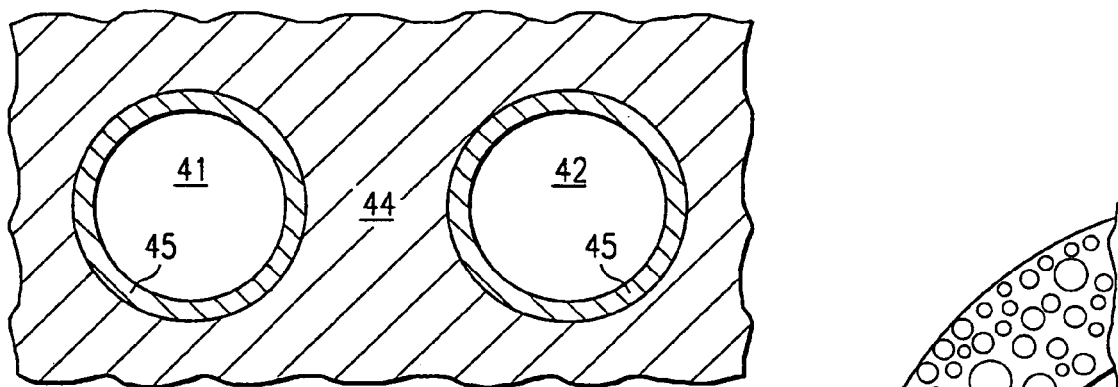
FIG. 4b is a cross section of neighboring wire bonds having a dielectric sheath.
Figure 4C:
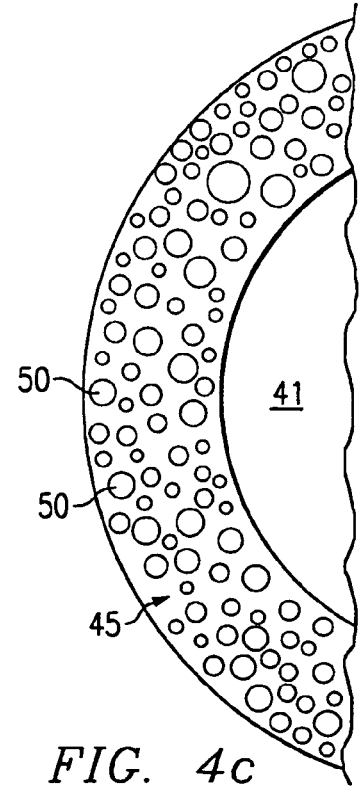
FIG. 4c is a cross section of a wire with a foamed polymer sheath.

FIG. 4b is a cross section of a pair of neighboring wires 41 and 42 sheathed in a relatively thin dielectric material 45, and embedded in molding compound 44. FIG. 4c provides a more detailed view of the cross section of a low dielectric constant material 45 coating a wire 41. The polymeric medium 45 filled with pockets 50 of air or gas is a foamed polymer, having both very low density, and effectively a very low dielectric constant resulting from the interspersed pockets of air.

In a preferred embodiment, the dielectric coating is a foamed polymer produced in situ by reacting components of a polymer. Such a foamed polymer is a polyurethane having pockets of carbon dioxide incorporated throughout the medium. Polyurethane is produced by a polyol reacting with a diisocyanate, and the foaming is generated by adding water and additional isocyanate. (1) Alternately, many other embedding resins are made into low density foams by adding blowing agents, unless their cure is affected. (2) A blowing agent is impregnated into a thermosetting polymer to create foamed polymers of materials such as polyetherimide, polypropylene, epoxy, or polyimide.

The dielectric constant of a polymeric material having a large volume of air pockets dispersed throughout is effectively reduced to approaching that of air, or in the range of 1.0 to 2.3. Results of the wire bond models, given in Table 1 show that a thin film of such a coating reduces mutual capacitance between neighboring wires in a plastic molded package by a factor of about 3, and thus significantly reduces the propensity for parasitic coupling, and cross talk between wires. The dielectric medium thickness is a minimum of 2.5 microns on all surfaces to achieve this level of capacitance change.

Placement control of the dielectric material is not critical; a minimum film thickness of 2.5 microns is sufficient to provide the reduction in capacitance, and may be much thicker. Swelling of the dielectric medium during foaming serves to control flow or run out of the polymer, and thus run out onto the leads which extend outside the molded package is of little concern. The dielectric material around the ball bond and surrounding chip bond pad provides a seal against moisture ingress, and thus serves to enhance reliability of the device. The foamed polymer sheath can surround each wire, the sheath covering substantially only the wire and wire connections to the pads on the integrated circuit chip and the conductive leads and not covering other portions of the chip and the conductive leads.

The effective elastic modulus of the dielectric material is very low as a result of the embedded air pockets, thus stress on the wires is reduced, as compared to encasing in a more brittle coating, or in conventional molding compound.

The method for forming an integrated circuit device having low mutual capacitance between bond wires includes the following; a polymeric material is disposed on each of the wires after the bonding to the chip and lead finger has been completed, the foaming reaction is allowed to proceed, and the polymer is cured prior to over molding with a conventional molding compound, such as epoxy novolac.

The preferred embodiment described above is a wire bonded integrated circuit in an over-molded plastic package, wherein the wires are surrounded by a very low density dielectric material in order to minimize capacitance of the wires. It should be noted that in this embodiment, the wires are held in place by the foamed dielectric material, and that sweep or sagging of the wires as a result of mold flow or mechanical damage is decreased. Therefore, not only is the capacitance better controlled, but wire shorting is eliminated.

A second embodiment of the current invention is to prevent movement or displacement of bonding wires in cavity packages, and thus eliminate potential shorting between wires or to substrates. Leaded surface mount or Ball Grid Array packages having either plastic or ceramic housing are included in a cavity package embodiment of this invention. Further, the drawings have indicated bond wires to leads which are typically associated with lead frames, but packages having leads on dielectric substrates are also embodiments of this invention.

While preferred embodiments and some alternative applications of the invention have been described above, they are not intended to be limited, but instead it should be understood that various modifications may be made from the specific details described herein without departing from the spirit and scope of the invention as set forth in the appended claims.

What is claimed is:

1. A method of packaging a semiconductor device having reduced self and mutual bond wire capacitance, including the following steps;
    providing one of a substrate having leads or lead frame with a chip pad;
    providing and attaching a semiconductor chip having pads to said one of said substrate or chip pad of a lead frame,
    wire bonding respective ends of a plurality of wires to the pads on the chip and to leads on said substrate or lead frame,
    disposing a relatively low dielectric constant polymeric material with foaming agent onto said wire bonds,
    allowing the foaming reaction to proceed to near completion,
    curing said polymeric material, and
    molding one of a housing or package encasing said chip and polymeric material with a mold compound having a dielectric constant higher than the dielectric constant of the polymeric material.

2. A method of fabricating plastic encapsulated semiconductor device having decreased self and mutual bond wire capacitance, comprising the steps of:
    providing an integrated circuit chip having connecting pads, conductive leads and wires connecting each of said pads to one of said conductive leads;
    providing a plurality of wire bonds connecting pads on said integrated circuit chip to said conductive leads;
    forming a foamed polymer sheath surrounding each wire, said sheath covering substantially only said wire and wire connections to said pads on said integrated circuit chip and to said conductive leads, and not covering other portions of said chip and said conductive leads, and
    providing a mold compound encasing the chip, sheathed wires, and leads.

3. The method of claim 2 wherein the effective dielectric constant of the sheath surrounding bond wires is in the range of 1.0 to 2.3.

4. A method of fabricating a plastic encapsulated semiconductor device having decreased self and mutual bond wire capacitance, comprising the steps of:
    providing an integrated circuit chip having a plurality of closely-spaced wire bond connecting pads and conductive leads and wires connecting each said pad to a said conductive lead;
    providing a plurality of substantially parallel, closely-spaced wire bonds with said wires connecting pads on said integrated circuit chip to said conductive leads,
    surrounding each said wire with a relatively low dielectric constant sheath of at least one of a foamed polymer, a polyurethane foam or a foamed thermoplastic polymer, and
    encasing the chip, sheathed wires, and leads with a mold compound having a dielectric constant higher than the dielectric constant of said dielectric sheath.

5. The method of claim 4 wherein the thickness of the dielectric sheath is 2.5 microns, minimum on each surface.

6. The method of claim 4 wherein the distance between wires is in the range of 50 to 100 microns.

7. The method of claim 4 wherein the dielectric constant of the molding compound is in the range of 3.8 to 4.2.

8. The method of claim 4 wherein the mutual capacitance between bond wires is lower by a factor of 3 as compared to a device wherein the medium separating wires has a dielectric constant of 4.0.

9. The method of claim 4 wherein said device is packaged in a Ball Grid Array package.

10. The method of claim 4 wherein said device is packaged as a leaded surface mount package.

11. The method of claim 4 further comprising providing a cavity in said device and disposing said relatively low dielectric constant sheath within said cavity.

12. The method as in claim 11 wherein said device comprises a ceramic.

13. A method of fabricating a plastic encapsulated semiconductor device having decreased self and mutual bond wire capacitance, comprising the steps of:
    providing an integrated circuit chip having connecting pad, conductive leads and wires;

providing a plurality of substantially parallel, closely-spaced wire bonds connecting said wires to pads on said integrated circuit chip to said conductive leads, surrounding each wire with a low dielectric constant sheath comprising at least one of a foamed polymer, a polyurethane foam or a foamed thermoplastic polymer, said sheath covering substantially only said wire and wire connections to said pads on said integrated circuit chip and to said conductive leads, and not covering other portions of said chip and said conductive leads, and encasing the chip, sheathed wires, and leads with a mold compound.

* * * * *